United States Patent
Elian et al.

(10) Patent No.: US 7,157,189 B2
(45) Date of Patent: Jan. 2, 2007

(54) LITHOGRAPHIC PROCESS FOR REDUCING THE LATERAL CHROMIUM STRUCTURE LOSS IN PHOTOMASK PRODUCTION USING CHEMICALLY AMPLIFIED RESISTS

(75) Inventors: Klaus Elian, Erlangen (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 615 days.

(21) Appl. No.: 10/375,531

(22) Filed: Feb. 27, 2003

(65) Prior Publication Data

US 2003/0165751 A1    Sep. 4, 2003

(30) Foreign Application Priority Data

Feb. 27, 2002    (DE)    ................ 102 08 448

(51) Int. Cl.
G03F 9/00    (2006.01)
G03C 1/492    (2006.01)
G03C 1/494    (2006.01)
G03C 1/76    (2006.01)
G03C 5/00    (2006.01)

(52) U.S. Cl. ............ 430/5; 430/322; 430/270.1; 430/323; 430/324

(58) Field of Classification Search ............ 430/5, 430/322, 323, 324, 270.1
See application file for complete search history.

(56) References Cited

U.S. PATENT DOCUMENTS 5,250,375 A    10/1993    Sebald et al.
6,171,755 B1    1/2001    Elian et al.
6,251,558 B1    6/2001    Elian et al.
2003/0013022 A1*    1/2003    Czech et al. ............ 430/5

FOREIGN PATENT DOCUMENTS

EP    0 492 253 A1    7/1992
EP    0 874 281 A1    10/1998
EP    0 919 867 A2    6/1999

OTHER PUBLICATIONS

Tadashi Arai et al.: "A Chemical-Amplification Positive-Resist Design For 0.18μm Reticle Fabrication Using The 50-kV HL-800M Electron Beam System", *Part of the SPIE Conference on Photomask and X-Ray Mask Technology* V, Kawasaki, Japan, Apr. 1998, SPIE, vol. 3412, pp. 190-195.
Masa-aki Kurihara et al.: "Performance of a chemically amplified positive resist for next generation photomask fabrication", *Part of the SPIE Conference on Photomask and X-Ray Mask Technology V*, Kawasaki, Japan, Apr. 1998, SPIE, vol. 3412, pp. 279-291.

* cited by examiner

*Primary Examiner*—Geraldine Letscher
(74) *Attorney, Agent, or Firm*—Laurence A. Greenberg; Werner H. Stemer; Ralph E. Locher

(57) ABSTRACT

The invention relates to a process for the production of photomasks. A film of a photoresist, as used for structuring semiconductor substrates, for example a CARL resist, is applied to a chromium-coated quartz glass substrate. The photoresist layer is written on by means of a focused electron beam, heated and then developed. The now structured resist is treated with an amplification agent and thus increases in its etch resistance to an oxygen plasma. During etching of the bare chromium sections, the silicon introduced into the photoresist is converted into silicon dioxide, which forms a protective layer on the chromium layer. Thus, the structure written in by means of the electron beam can be transferred without loss into the chromium layer.

11 Claims, No Drawings

LITHOGRAPHIC PROCESS FOR REDUCING THE LATERAL CHROMIUM STRUCTURE LOSS IN PHOTOMASK PRODUCTION USING CHEMICALLY AMPLIFIED RESISTS

The invention relates to a process for the production of photomasks for optical lithography.

In the production of microchips, lithographic processes are used for structuring semiconductor substrates. In general, silicon wafers in which structures or components may also already have been introduced are used as a semiconductor substrate. First, a thin film of a photoresist is applied on the semiconductor substrate, which film may be changed in its chemical or physical properties by exposure to light. The photoresist contains a polymer having acid-labile groups and a photo acid generator which liberates a strong acid on exposure to light. The photoresist film is exposed, generally to monochromatic laser light having a specific wavelength, a photomask which contains all information about the structure to be reproduced being arranged in the beam path. The structure of the photomask is projected onto the photoresist film, the structure of the photomask being reduced in size by about a factor of 5. Exposed and unexposed parts are reproduced in the photoresist film, acid being liberated from the photo acid generator only in the exposed parts. A latent image, which is formed by the distribution of the acid in the photoresist film, is initially obtained. A heating step in which the acid-labile groups of the polymer are cleaved under the catalytic effect of the acid in the exposed parts and polar groups are liberated is now carried out. In a development step, only the exposed parts of the photoresist can then be selectively removed using a basic aqueous developer.

Lands in which the unchanged polymer is present and trenches which are arranged between the lands and in which the substrate is bare are formed. In the bare parts, the substrate can now be etched so that the desired structure, for example a trench for a trench capacitor, is transferred to the substrate. The structure is transferred in general by means of an etching plasma, for example an oxygen plasma or a halogen plasma. The poor resistance of the resist film to an etching plasma presents difficulties. The photoresist usually contains organic polymers which, for example in an oxygen plasma, are converted into gaseous products, and it is for this reason that the resist structure is rapidly removed from the substrate surface. In the preparation of the polymer, silicon-containing comonomers are therefore introduced into the polymer. In the oxygen plasma, the silicon forms a nonvolatile silicon dioxide film which protects the substrate from subtractive etching by the plasma. A further possibility is offered by the CARL process described in EP 0 395 917, which process permits subsequent modification of the resist (CARL=Chemical Amplification of Resist Lines). For this purpose, the polymer of the photoresist is provided with anchor groups, generally carboxylic anhydride groups, which can be introduced by copolymerization of maleic anhydride and to which the amplification agent can be bonded to the polymer via a reactive group. In this way, silicon-containing groups can be subsequently introduced into the polymer, with the result that the stability of the resist in an oxygen plasma can be increased. By incorporating the groups, the volume of the resist also increases, i.e. the resist lines broaden or the bare sections of the substrate become smaller, and it is therefore possible to represent structures which are below the limit of resolution of the optical system used for the exposure. The exposure of the resist film and the fixing of the structure by development of the resist film must be carried out comparatively rapidly since otherwise pot life effects occur and result in a deterioration of the imaged structure. Thus, basic impurities from the environment can penetrate into the resist layer and neutralize the liberated acid there. Furthermore, on prolonged standing, the liberated acid diffuses from the exposed parts into the unexposed parts, so that the structure imaged in the photoresist floats or, after development, the sidewalls of the resist structure are no longer perpendicular or the edges have considerable roughness.

The photomask arranged in the beam path is produced by writing on a substrate by means of an electron beam. For this purpose, a thin chromium layer is first applied to a transparent substrate, generally of quartz glass. A resist, which usually consists of polymethyl methacrylate (PMMA) dissolved in a suitable solvent is then applied to the chromium layer. After evaporation of the solvent, a thin PMMA film is obtained, on which the desired structure is written by means of a focused electron beam. Owing to the high energy of the electron beam, the polymer in the exposed sections is cleaved into short fragments which have a dissolution behavior differing from that of the original polymer. This different solubility is utilized to bare the substrate selectively only in the exposed parts. For this purpose, a developer, generally an organic solvent, is introduced onto the exposed resist layer so that short fragments formed from the polymer are dissolved in the developer. The developer with the dissolved polymer fragment is then removed, and the relief-like structure obtained is dried. In the trenches, the chromium layer is now bare and can be removed with the aid of an etching plasma. The plasma must be such that the chromium is converted into volatile compounds. In general, a plasma which is produced from a gas mixture comprising oxygen and chlorine is therefore used. However, owing to the oxygen content, the resist structure is strongly attacked and in particular removed at the edges. This results in a certain shrinkage in the line width, i.e. the chromium line formed has a smaller width than in the structure which was defined by writing with an electron beam. A loss of about 50 nm occurs per structure edge, i.e. the structure lines are about 100 nm narrower after etching than intended in the original layout. The shrinkage is taken into account when designing the mask layout, and the width of the lines is therefore planned to be correspondingly larger.

With increasing miniaturization of the structures to be produced on the semiconductor substrate, the structure dimensions on the photomask also decrease. In addition, diffraction effects result in a deterioration in the imaging quality. The deterioration in the imaging quality, for example a flattening of the sidewalls between exposed and unexposed parts, is counteracted by providing on the photomask, for example, nonimaging auxiliary structures which make the transition between exposed and unexposed sections steeper. The photomask is thus no longer similar to the imaged structure. Owing to the auxiliary structures, the density of the structural elements which have to be arranged on the photomask increases. Furthermore, the auxiliary structures must be arranged at a defined distance from the main structure and must have a certain line width which is less than the limit of resolution of the exposure optical system. It is therefore necessary to transfer the structure written on the resist by means of the electron beam into the chromium layer, as far as possible without structure loss. Furthermore, the mask write times increase with increasing structure density, it being necessary in each case for sufficient irradiation intensity to act on the resist film in order reliably to achieve a modification of the polymer.

It is therefore an object of the invention to provide a process for the production of photomasks for optical lithography, in particular for the structuring of semiconductor substrates, which process also permits a precise representation of structures having extremely small dimensions.

The object is achieved by a process for the production of photomasks for optical lithography, a transparent substrate being provided, a layer of a mask material being applied on the transparent substrate, a layer of a photoresist being applied on the layer of the mask material, the photoresist at least comprising:
  a film-forming polymer which comprises acid-labile groups which are cleaved under the action of acid and liberate groups which result in an increase in the solubility of the polymer in aqueous alkaline developers, and which furthermore comprises anchor groups for the linkage of amplification agents, it also being possible for the anchor groups to be present in the form of a protected anchor group;
  a photo acid generator;
  a solvent;

the layer of the photoresist being heated in order to remove the solvent so that a photoresist film is obtained, a structure being written in the photoresist film by means of a focused electron beam to give an exposed photoresist film which comprises exposed parts, in which a strong acid is liberated from the photo acid generator, and unexposed parts, in which no acid has been liberated;

the exposed resist film being heated so that, in the exposed parts, the acid-labile groups on the film-forming polymer are cleaved and polar groups are liberated, a contrasted resist film being obtained;

the contrasted resist film being developed using a developer, to give a structured resist having lands and trenches which are arranged between the lands and in which the mask material is bare;

an amplification agent being added to the structured resist, which amplification agent has at least one reactive group which can react with the anchor group of the polymer with the result that the amplification agent is bonded to the polymer contained in the lands, so that an amplified resist is obtained;

if required, excess amplification agent being removed; the bare mask material being etched away, and the structure being transferred to the layer of the mask material.

The process, according to the invention, for the production of photomasks for optical lithography utilizes, for the structuring of a layer of a mask material, chemically amplified photoresists known from the structuring of semiconductor substrates. Owing to the chemical amplification, the photoresist has high photosensitivity and a high quantum yield, so that the writing times required for writing the structure into the photoresist film decrease considerably. Owing to the possibility of a chemical amplification, the resist structure can be subsequently modified in its etch resistance. The groups to be introduced are selected depending on the mask material. In this way, a shrinkage of the structured resist can be substantially avoided, i.e. overetching is suppressed so that the structure written into the photoresist film by means of the electron beam can be transferred into the layer of the mask material without loss.

Any slight shrinkage occurring during the etching process can be compensated by a corresponding expansion of the resist structure by chemical amplification. Thus, the production of photomasks having a high structure density has become possible by the process according to the invention, it being possible to represent defined distances, for example between a main structure and an auxiliary structure, with high accuracy.

The advantage of the process according to the invention is that photoresists which are known from the structuring of semiconductor substrates and for whose processing a great deal of knowledge has accumulated can be used for the production of photomasks. For carrying out the individual operations, it is possible, on the one hand, to rely on known apparatuses which are already used for mask production, for example for writing the mask by means of a focused electron beam, and, on the other hand, to rely on apparatuses which are already used for structuring semiconductor substrates and which merely have to be modified for processing the substrate.

When carrying out the process according to the invention, a transparent substrate is first provided. Substrates which may be used are the substrates which are known from mask production and which must have sufficiently high transparency for radiation of a wavelength as subsequently used for the exposure of the photoresist layer applied on the semiconductor substrate. Owing to their high transparency over a large wavelength range, quartz glass substrates are particularly preferred.

First, a thin layer of a mask material is applied to the substrate. It is possible to employ the materials known for the production of photomasks. The choice of material depends on the mask type which it is intended to produce by the process according to the invention. The mask material may be, for example, a material having phase shift properties or a semitransparent material which has phase shift properties. For the sake of simplicity, the process according to the invention is described here for a COG mask (COG="chrome on glass") by way of example. First, a thin chromium layer is applied to the substrate, for example by sputtering. In the simplest embodiment of the process according to the invention, a thin layer of a photoresist, as used, for example, for the CARL process, is then applied to the chromium layer serving as mask material. The application of the photoresist can be effected, for example, by spin-coating or spraying on or by a dipping method. The layer obtained from the photoresist is then heated in order to expel the solvent contained in the photoresist and to heal defects in the photoresist film.

The photoresist comprises at least one film-forming polymer which has acid-labile groups which are catalytically cleaved under the action of acid, liberating polar groups which result in an increase in the solubility of the polymer in aqueous alkaline developers. Examples of acid-labile groups are: tert-alkyl ester, tert-butoxycarbonyloxy, tetrahydrofuranyl, tetrahydropyranyl, tert-butyl ether, lactone or acetal groups. tert-Butyl ester groups are particularly preferred. Polar groups, such as, for example, carboxyl groups or acidic hydroxyl groups, are liberated from these acid-labile groups under the catalytic action of acid, which polar groups increase the polarity of the polymer and hence its solubility in polar, preferably alkaline developers.

The film-forming polymer can therefore be obtained by polymerization or copolymerization of corresponding monomers.

Suitable monomers by means of which an acid-labile group can be introduced into the polymer are, for example, acrylates, methacrylates, maleic mono-esters and diesters, itaconic monoesters and diesters, norbornenecarboxylic esters or norbornenedicarboxylic monoesters and diesters. Corresponding repeating units of the polymer are shown below. There, Y is a group which can be eliminated by acid, as contained, for example, in one of the abovementioned groups and after whose elimination the polar group, for example a carboxyl or hydroxyl group, is liberated, and $R^2$ is a non-acid-labile radical, for example an alkyl group having 1 to 10 carbon atoms. Furthermore, n is an integer from 1 to 10.

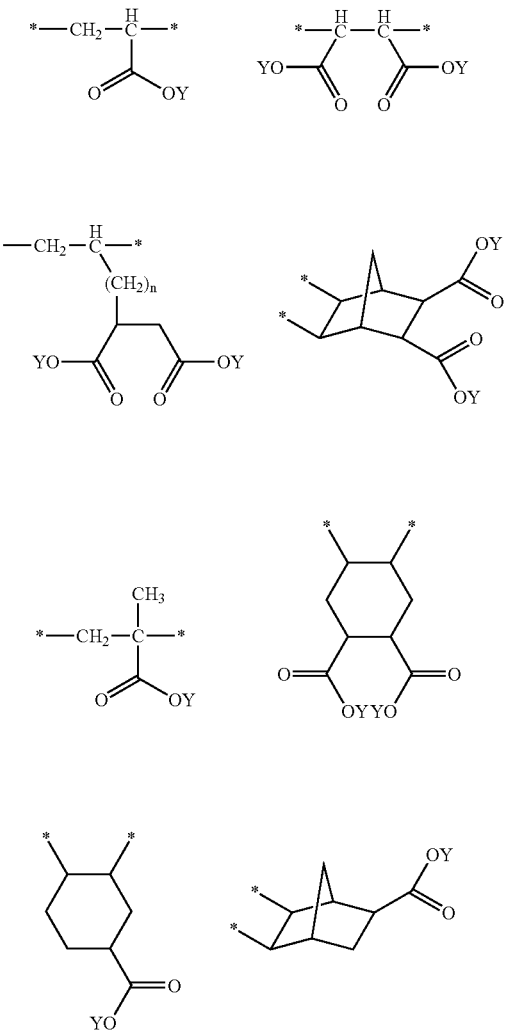

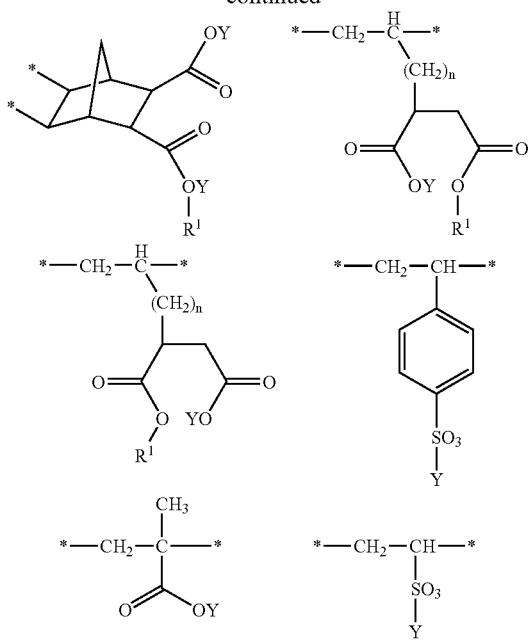

The elimination of the acid-labile radical from the acid-labile group with liberation of the polar group is shown below by way of example for two preferred repeating units. In the first example, the repeating unit comprises a tert-butyl ester group, from which a carboxyl group is liberated under the action of acid.

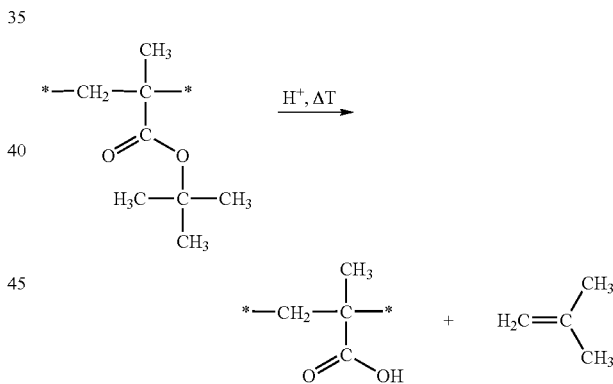

In the second example, the acid-labile group comprises a tert-butoxycarbonyloxy radical which is bonded to a phenolic hydroxyl group. Under the action of acid, an acidic hydroxyl group is therefore liberated as a polar group.

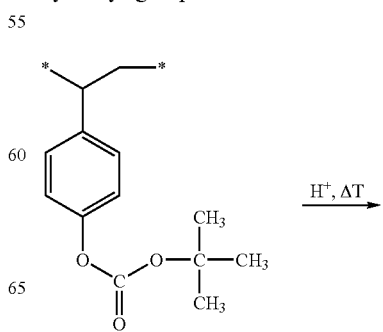

-continued

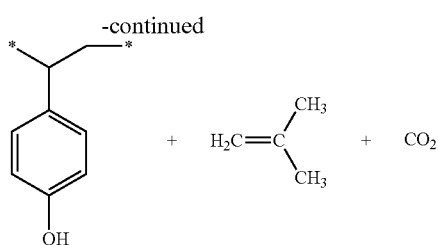

In addition, the polymer contains anchor groups which permit subsequent introduction of groups. Suitable anchor groups are, for example, epoxy groups, isocyanate groups, ketenes and acid anhydrides. Carboxylic anhydride groups are particularly preferably contained in the polymer since, on the one hand, they have a sufficiently high stability to permit preparation and processing of the polymer, as necessary for industrial requirements, and, on the other hand, they have a sufficiently high reactivity to undergo a reaction with a corresponding reactive group of the amplification agent, preferably a nucleophilic group, within periods which are suitable for an industrial application.

Particularly preferably, the polymer comprises carboxylic anhydride groups as reactive anchor groups. These can be introduced into the polymer by copolymerizing, for example, maleic anhydride, itaconic anhydride, methacrylic anhydride, cyclohexene-dicarboxylic anhydride or norborenedicarboxylic anhydride in the preparation of the polymer. Exemplary repeating units of the polymer which have a dicarboxylic anhydride function are shown below:

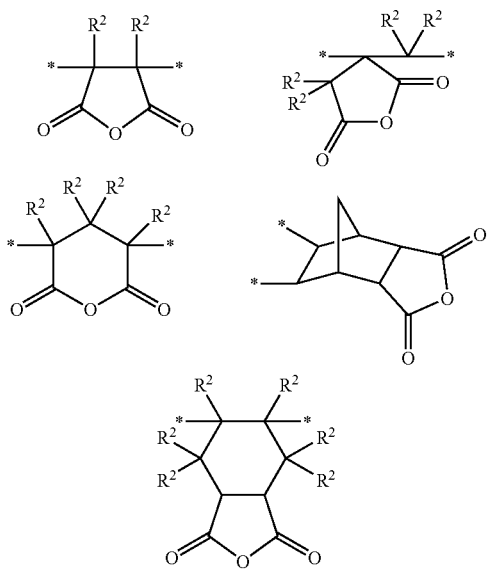

There, $R^2$ is preferably hydrogen or any desired other radical, in particular an alkyl radical having 1 to 10 carbon atoms. The radicals $R^2$, independently of one another, may have the stated meaning.

These monomers may be copolymerized with further monomers. A suitable monomer is, for example, styrene. In addition to said monomers, other monomers customary for the preparation of polymers contained in photo-resists can also be used. For example, cycloaliphatic groups can be introduced by copolymerization of norbornene and norbornene derivatives. Silicon-containing groups can be introduced by copolymerization of trialkylallylsilanes. The exact composition of the polymer depends on the properties which are required for further processing. If the photoresist is also used, for example, for etching the substrate, it must have sufficient etch resistance. This is achieved by introducing silicon-containing groups, aromatic groups or alicyclic groups into the polymer.

In addition to the polymer, the photoresist contains a photo acid generator, which must have a sufficiently high sensitivity for the electron beam, in order to be able to liberate an amount of acid required for rapid cleavage of the acid-labile groups. Photo acid generators which may be used are all compounds which liberate acid on irradiation. Advantageously, onium compounds are used, as described, for example, in EP 0 955 562 A1.

Finally, the photoresist also comprises a solvent in which the polymer and the photo acid generator can be dissolved with formation of a clear solution. For example, methoxypropyl acetate, cyclopentanone, cyclo-hexanone, γ-butyrolactone, ethyl lactate, diethylene glycol diethyl ether, diethylene glycol dimethyl ether or a mixture of at least two of these compounds may be used as a solvent of the resist. In general, however, all conventional solvents or mixtures thereof which are capable of taking up the resist components to give a clear, homogeneous solution having a long shelf life and which ensure a good layer quality on coating of the substrate can be used.

The resist generally has the following composition:

film-forming polymer: from 1 to 50% by weight, preferably from 2 to 10% by weight;

photo acid generator: from 0.01 to 10% by weight, preferably from 0.01 to 10% by weight;

solvent: from 50 to 99% by weight, preferably from 88 to 90% by weight.

The photo resist may also contain further components in addition to said compounds. For example, additives which increase the quantum yield in the liberation of the acid may be present. Furthermore, additives which influence the resist system advantageously with respect to resolution, film formation properties, shelf life, pot life effects, etc. can be added.

By writing with the focused electron beam, a latent image of the desired structure is produced in the photoresist film, which image contains the liberated acid in the exposed parts while the unexposed parts remain acid-free.

The exposed photoresist film is now heated, the acid-labile groups of the polymer being cleaved under the catalytic action of the acid in the exposed parts and polar groups being liberated. The resist film is thus contrasted, i.e. differentiation is produced between the exposed and unexposed parts by the different polarity of the polymer. In the exposed parts, the film-forming polymer has been converted into a polar form, whereas it continues to be present in a nonpolar form in the unexposed parts.

The contrasted resist film is then developed by means of a developer. For this purpose, an aqueous alkaline developer is generally used, for example a 2.38% strength aqueous tetramethylammonium solution. Such developers can be obtained from commercial suppliers. In the exposed parts, the photoresist is removed by the developer and the mask material arranged under the photoresist is bared. In order to increase the etch resistance of the resultant structure, the structured resist is chemically amplified. For this purpose, an amplification agent which has a reactive group which can react with the anchor group of the polymer is added to the structured resist. A nucleophilic group which can nucleophilically attack the anchor group of the polymer, for example a carboxylic anhydride group, is generally chosen as the reactive group of the amplification agent. The amplification agent is then fixed to the polymer via a preferably covalent bond, for example an amide bond. The etch stability of the amplified resist structure can be influenced in a targeted manner by the further groups contained in the amplification agent in addition to the reactive group. Excess amplification agents can, if required, then be removed. In the trenches of the amplified structured resist, the mask material is now bare and can be etched away by means of a suitable plasma. If a chromium layer is used as mask material, a plasma produced from an oxygen/chlorine gas mixture can be used, as has also been used to date in the known processes for the production of photomasks. In this case, silicon-containing groups are preferably introduced into the polymer by the amplification agent, which silicon-containing groups are converted by the oxygen component of the etching plasma into a nonvolatile silicon dioxide film, which protects the layer of the mask material from overetching. Loss-free transfer of the resist structure into the chromium layer is therefore effected.

In principle, all materials customary for photomask production can be used as a substrate for the production of the photomask. Owing to its transparency and mechanical strength, a quartz glass substrate is preferably used as the transparent substrate.

The process according to the invention is suitable per se for the production of all photomask types. However, the process according to the invention is particularly suitable for the production of COG masks. The layer of the photomask material is therefore preferably a chromium layer.

Writing in the photoresist film should preferably be effected as rapidly as possible in order to suppress as far as possible pot life effects. The electron beam must therefore have a sufficiently high energy to be able to liberate the required amounts of acid from the photo acid generator. On the other hand, the energy of the electron beam must not be too high, so that no chemical reactions are triggered in the polymer itself, which can lead to the formation of insoluble byproducts. The electrons of the electron beam are suitably accelerated with an acceleration voltage in a range from 15 to 100 kV. Suitable irradiation intensities are in the range of 1 $\mu C/cm^2$–40° C./$cm^2$. For example, an irradiation intensity of 1 $\mu C/cm^2$ at an acceleration voltage of 50 keV is particularly suitable.

A certain time is required for writing in the photoresist film. During the write process, the imaging quality of the structure element initially written in should not decrease, and it is for this reason that pot life effects are to be substantially suppressed. This can be achieved, for example, by reducing the write times. For this purpose, a sensitizer by means of which the quantum yield of the cleavage of the photo acid generator is increased can be added to the photoresist. As a result, more acid is formed for the elimination of the acid-labile groups of the polymer, with identical incident electron dose and identical initial content of photo acid generator in the resist. The mass ratio of photo acid generator to sensitizer in the resist is generally from about 0.5:1.5 to 1.5:0.5.

An electron beam-sensitive sensitizer which may be used is, for example, a compound of the following structure:

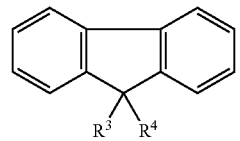

in which $R^3$=OH or OR, $R^4$=COOH or COOR, with R=$C_1$- to $C_5$-alkyl. A particularly preferred sensitizer is, for example, 9-hydroxy-9-fluorene-carboxylic acid.

In order to suppress diffusion of the acid liberated in the exposed parts into the unexposed parts, the photoresist, in a preferred embodiment, contains a base. Suitable bases are, for example, acetates, such as triphenylsulfonium acetate, or alkylamines, such as octylamines or trimethylamine. In general, it is possible to use amines of the formula $NR^aR^bR^c$, in which $R^a$, $R^b$ and $R^c$ in each a case independently, are an alkyl radical having 1 to 10 carbon atoms. The strong acid diffusing in is neutralized by the base and can no longer give rise to a catalytic cleavage of the acid-labile groups when the exposed resist film is heated.

The mask materials are generally etched using an oxygen-containing plasma. Particularly preferably, the amplification agent therefore comprises a silicon-containing group. These groups are converted by the oxygen of the etching plasma into silicon dioxide and form an etch-stable protective layer on the layer of the mask material.

In a particularly preferred embodiment, the amplification agent comprises at least two reactive groups. In the amplification, the amplification agent produces further crosslinking of the polymer, with the result that the stability of the resist structure increases and removal of the amplified resist by a solvent is substantially suppressed.

The amplification agent is preferably a silicon compound having a basic function, in particular an aminosiloxane. Chain-like dimethylsiloxanes having terminal aminopropylene units and from 2 to 51, preferably from 2 to 12, silicon atoms per molecule have proven particularly useful. Such a chain-like dimethylsiloxane is shown below by its general structural formula.

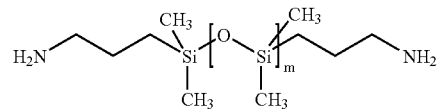

m = 1 - 50

Further examples of amplification agents having amino-functional groups can be represented by the following general structural formulae.

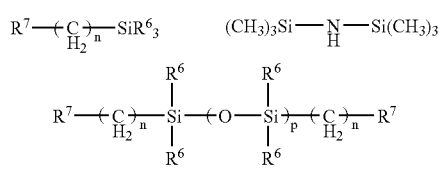

-continued

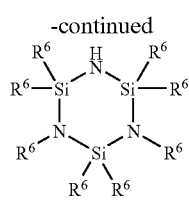

in which $R^6$=H, alkyl or aryl;
and $R^7$=

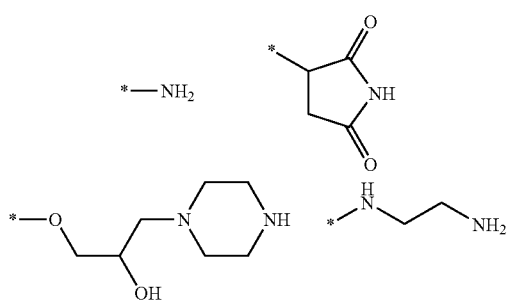

In addition to silicon-containing basic amplification agents, other basic compounds are also suitable for carrying out the process according to the invention. These compounds preferably contain aromatic groups since this increases the resistance of the amplified resist to an etching plasma. Some suitable amplification agents are shown below by way of example.

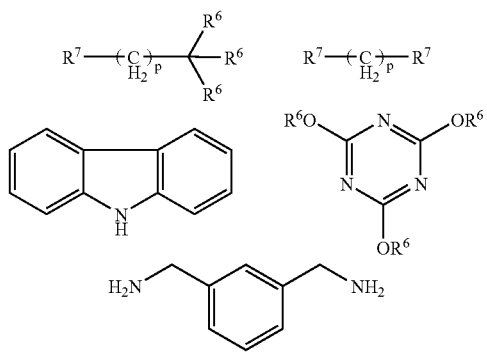

in which the radicals $R^2$ and $R^3$, independently of one another, have the abovementioned meaning and p is 0–30 and n is 1–20.

The amplification agent can in principle also be applied from the gas phase onto the structured resist. However, the amplification agent is preferably applied as a solution on the structured resist. In this way, the amplification reaction can be very easily controlled. The resist can be swollen by the solvent of the amplification agent, so that the amplification agent also penetrates into deeper layers of the resist and can be bonded there to the polymer. The extent to which the amplification agent is incorporated into the polymer can be controlled by the duration of the reaction, the reaction temperature and the concentration in which the amplification agent is present in the solution.

The photoresist is generally applied only in a small layer thickness, in order to ensure liberation of the acid also in deeper resist layers. It may therefore be advantageous first to apply a layer of a photo-insensitive bottom resist to the layer of the mask material and only thereafter to apply the layer of the photoresist to the layer of the photoinsensitive resist. Then, as explained above, the photoresist is written on by means of a laser beam, developed and chemically amplified. In the case of anisotropic etching with an etching plasma, the structure produced from the photoresist is first transferred into the bottom resist and the structure is then transferred into the mask material. If required, a change of plasma system may also be carried out. For example, a novolak can be used as the bottom resist.

The invention is explained in more detail with reference to an example.

EXAMPLE 1

Synthesis of a Resist Polymer

The polymer is synthesized by means of free radical polymerization. For this purpose, 20.5 g (209 mmol) of maleic anhydride, 23.8 g (167 mmol) of tert-butyl methacrylate, 3.3 g (21 mmol) of methacrylic acid, 2.4 g (21 mmol) of allyltrimethylsilane, 0.69 g (4.2 mmol) of α, α'-azobisisobutyronitrile as a free radical initiator and 0.34 g (1.7 mmol) of dodecyl mercaptan as a chain regulator are dissolved in 40 g (50 mmol) of 2-butanone and refluxed for 3 hours (80° C.). Thereafter, 4.0 g (5.0 ml) of methanol are added for partial alcoholysis of the anhydride, and the reaction solution is refluxed for a further 24 hours. The reaction solution is allowed to cool to room temperature and 35.0 g (27.5 ml) of 2-propanol are added with vigorous stirring. The solution obtained is added dropwise to a solution of 10.5 g (13.1 ml) of 2-butanone, 337.0 g (429 ml) of 2-propanol and 329.0 g (329.0 ml) of water in the course of 30 minutes and with very vigorous mechanical stirring. The polymer is precipitated as a fine, white powder. Stirring is continued for 30 minutes and the solvent is then filtered off with suction over a G3 frit under slightly reduced pressure. The white precipitate is washed with a solution of 16.0 g (20.0 ml) of 2-butanone, 111.0 g (141 ml) of 2-propanol and 100.0 g (100 ml) of water and dried for 72 hours at 80° C. in a high vacuum. 40 g (80% of theory) of fine, white powder are obtained as the reaction product.

EXAMPLE 2

Production of the Photoresist

8% by weight of the polymer obtained in example 1 are dissolved, with 5% by weight, based on the solid polymer, of triphenylsulfonium hexafluoropropane-sulfonate, in 92% by weight of 1-methoxy-2-propyl acetate.

EXAMPLE 3

Application of a Resist Layer to the Mask Blank

A commercial photoresist (novolak with 1,2-methoxy-propyl acetate as solvent, TOK BLC001) is applied as a bottom resist, by means of spin-coating at 2 000 revolutions per minute for 20 seconds, to a 2 mm thick quartz glass plate sputtered with chromium. The solvent is then evaporated by heating to 110° C. for 90 seconds. By heating to 235° C. for 90 seconds, the novolak is crosslinked. An about 500 nm thick novolak layer having high chemical resistance is obtained. The photoresist obtained in example 2 is applied as a photoresist layer to the bottom resist by spin-coating at 2 000 revolutions per minute for 20 seconds. The solvent of the photoresist is evaporated by heating to 140° C. for 60 seconds. A solid photoresist layer is obtained.

EXAMPLE 4

Writing in the Photoresist Layer

A test layout consisting of line/trench patterns of different dimensions (range 350 nm–100 nm) and different doses (range 3 µC/cm$^2$–37 µC/cm$^2$) is written on the quartz glass plate provided with a resist layer and obtained in example 3, with the aid of a Jeol JSM840/Sieteo Nanobeam pattern generator at 40 keV. The sample is then heated to 140° C. for 60 seconds. At this temperature, the chemical amplification reaction takes place. The acid protons produced by the electron irradiation cleave the acid-labile groups of the polymer in a catalytic reaction.

EXAMPLE 5

Development of the Described and Heated Photoresist

The exposed and contrasted substrate obtained in example 4 is treated by puddle development with a commercially available developer based on tetramethyl-ammonium hydroxide (TMA 238 WA from JSR). The development time is 1 minute. Thereafter, the substrate is washed with water for 20 seconds and blown dry with nitrogen. A relief-like image of the layout described in example 4 is obtained in the upper photoresist layer.

EXAMPLE 6

Silylation of the Photoresist

The substrate obtained in example 5 is treated in a puddle process for 60 s with a reaction solution which consists of 2% by weight of diaminopropyl-(oligo-siloxane) and 98% by weight of 1-hexanol. Thereafter, the substrate is washed for 20 seconds with isopropanol and then blown dry with nitrogen.

EXAMPLE 7

Structuring of the Lower Resist Layer and of the Chromium

The substrate obtained in example 6 is etched in a plasma etching apparatus with the use of an oxygen/halogen gas mixture. Both the bottom resist layer and the chromium are removed in the areas which are not protected by the upper photoresist layer.

We claim:

1. A process for producing photomasks for optical lithography, which comprises the steps of:
   providing a transparent substrate;
   applying a layer of a mask material on the transparent substrate;
   applying a layer of photoresist on the layer of the mask material, the photoresist comprising:
      a film-forming polymer containing acid-labile groups to be cleaved under action of acid and liberating groups resulting in an increase in solubility of the film-forming polymer in aqueous alkaline developers, and further containing anchor groups for linkage of amplification agents;
      a photo acid generator; and
      a solvent;
   heating the layer of the photoresist to remove the solvent resulting in a photoresist film being obtained;
   writing a structure in the photoresist film using a focused electron beam resulting in an exposed photoresist film having exposed parts, in which a strong acid is liberated from the photo acid generator, and unexposed parts, in which no acid has been liberated;
   heating the exposed photoresist film so that, in the exposed parts, acid-labile groups on the film-forming polymer are cleaved and polar groups are liberated resulting in a contrasted resist film being obtained;
   developing the contrasted resist film using a developer resulting in a structured resist having lands and trenches disposed between the lands and in which the mask material is bare;
   adding an amplification agent to the structured resist, the amplification agent having at least one reactive group which can react with the anchor groups of the film-forming polymer resulting in the amplification agent bonding to the film-forming polymer contained in the lands, so that an amplified resist is obtained;
   removing any excess amplification agent; and
   etching away bare mask material resulting in the structure being transferred to the layer of the mask material.

2. The process according to claim 1, which further comprises providing a quartz glass substrate as the transparent substrate.

3. The process according to claim 1, which further comprises forming the layer of the mask material as a chromium layer.

4. The process according to claim 1, which further comprises irradiating the photoresist film with the electron beam having a dose of 1 µC/cm$^2$ to 40 µC/cm$^2$.

5. The process according to claim 1, which further comprises forming the photoresist to contain a sensitizer.

6. The process according to claim 1, which further comprises forming the photoresist to contain a base.

7. The process according to claim 1, which further comprises forming the amplification agent with a silicon-containing group.

8. The process according to claim 1, which further comprises forming the amplification agent with at least two reactive groups.

9. The process according to claim 1, which further comprises applying the amplification agent in a form of a solution to the structured resist.

10. The process according to claim 1, which further comprises:
    applying a layer of a photoinsensitive bottom resist to the layer of the mask material; and
    applying the layer of the photoresist to the layer of the photoinsensitive bottom resist.

11. The process according to claim 1, which further comprises using protected anchor groups as the anchor groups.

* * * * *